United States Patent [19]

Shoji

[11] Patent Number: 4,649,296

[45] Date of Patent: Mar. 10, 1987

[54] SYNTHETIC CMOS STATIC LOGIC GATES

[75] Inventor: Masakazu Shoji, Warren, N.J.

[73] Assignee: AT&T Bell Laboratories, Murray Hill, N.J.

[21] Appl. No.: 630,434

[22] Filed: Jul. 13, 1984

[51] Int. Cl.[4] .................. H03K 19/017; H03K 19/094; H03K 19/20

[52] U.S. Cl. ..................................... 307/451; 307/443

[58] Field of Search ............... 307/443, 448, 451, 452, 307/453, 481

[56] References Cited

U.S. PATENT DOCUMENTS 3,911,289 10/1975 Takemoto ........................... 307/451

4,345,170 8/1982 Sampson, III ...................... 307/452

Primary Examiner—Stanley D. Miller
Assistant Examiner—M. R. Wambach
Attorney, Agent, or Firm—David T. Caplan

[57] ABSTRACT

A multi-input CMOS integrated circuit gate is made with fewer PFETs connected between the source voltage and the output node than there are inputs. In many cases only a single PFET is employed. The inputs are applied through a logic network connected to the gate of the remaining PFET. The gate exhibits reduced parasitic capacitance, better PFET-NFET size ratios, and higher speeds.

5 Claims, 10 Drawing Figures

SYNTHETIC CMOS STATIC LOGIC GATES

FIELD OF THE INVENTION

This invention relates to semiconductor integrated circuit (IC) chips and more particularly to such chips of the complementary metal-oxidesemiconductor (CMOS) type.

BACKGROUND OF THE INVENTION

A conventional, single input CMOS logic gate circuit for processing an input signal typically employs a P-channel field effect transistor (PFET) connected between a power supply source ($V_{DD}$) and an output node. The PFET is operative to "pull-up" the voltage of the output node essentially to $V_{DD}$ in response to the input signal when applied to the input terminal (gate electrode) of the PFET as is well known. The circuit also includes an N-channel transistor (NFET), connected between the output node and ground. The NFET is operative to "pull-down" the voltage of the output node to a "low" level appropriately, typically ground, in response to the input signal when applied to the input terminal of the NFET as is also well known.

For multiple input NOR gates, the pull-up of the output node requires a multiplicity of PFETs, connected electrically in series drain to source, between the voltage supply $V_{DD}$ and the output node. The number of these PFETs is equal to the number of input signals to which the NOR gate is designed to respond, a separate input for each input signal. Also, a like plurality of N-channel transistors is connected electrically in parallel between the output node and ground.

Similarly, other multiple input CMOS logic gates require a multiplicity of P-channel and N-channel transistors. For such multiple input gates it is difficult to achieve high speed pull-up operation. The reason for this is that for high speed operation the RC delays characteristic of the PFET and NFET segments of the circuit have to be set about equal to each other. Since the resistances of the PFETs are in series, reduction in the total resistance of the PFET segment would require much larger PFET elements than NFET elements as is well understood. In turn, the total parasitic capacitance inherent in a chain of relatively large capacitance PFET's would undesirably increase and thereby dictate relatively slow operation. Consequently, there is a practical limit to operating speeds of multi-input CMOS logic gates, such as NOR gates.

BRIEF DESCRIPTION OF AN ILLUSTRATIVE EMBODIMENT OF THE INVENTION

The present invention provides for increasing the speed of the (logic) operation of a multi-input CMOS logic gate by using only relatively few PFETs between the power supply $V_{DD}$ and the output node. The use of fewer PFETs for the pull-up operation permits the PFET and NFET delays in the circuit to be equated more easily, reduces the parasitic capacitance exhibited by a chain of relatively large-capacitance PFETs and thus reduces the minimum delay characteristic of such a chain. The original logic operation of the PFET segment of the gate is retained in the absence of the full complement of PFETs by adding a plurality of additional logic gates outside of the path between the power supply $V_{DD}$ and the output node. Thus, it is in accordance with the present invention to reconfigure the PFET portion of a CMOS circuit in a fashion, that, though the total number of transistors in the entire circuit may be increased, the number in the chain of pull-up (PFET) transistors is decreased.

In one embodiment the additional gates are organized into first and second circuit arrangements with a common output node for both. The output node is connected to the gate electrode of a single remaining PFET pull-up transistor. The arrangements thus serve to "synthesize" (simulate) the pull-up function of the multiple inputs of the drain--source PFET series circuit characteristic of the PFET pull-up segment of prior art CMOS gate circuits. Significant improvements in speed of operation of multi-input CMOS logic gates are achieved. A CMOS multi-input gate having fewer PFETs connected electrically in series between the power supply $V_{DD}$ and the output node than the number of input signals to be processed by the gate is considered a significant departure from prior art thinking.

The term "fanout" is used herein to characterize the ratio between the size of a driver circuit compared to the sum of the sizes of the receiver circuits driven by the driver circuit.

DETAILED DESCRIPTION

Figure 1:
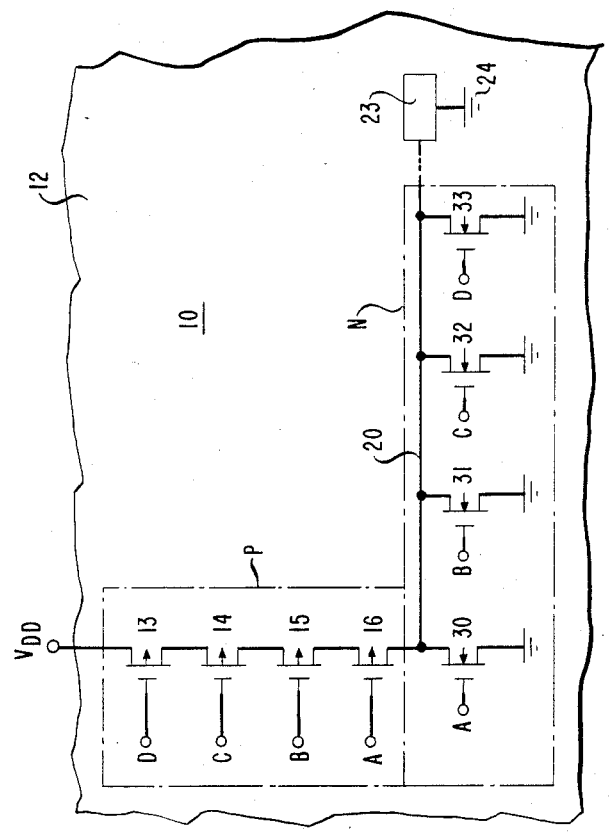
FIG. 1 is a circuit diagram of a prior art multi-input CMOS static NOR logic gate.

FIG. 1 shows a typical prior art CMOS static multi-input NOR gate circuit 10. The circuit is fabricated in a semiconductor chip 12 by well known photolithographic, diffusion, deposition and etching techniques. Individual FETs are represented according to the accepted convention, P-channel transistors (PFETs) having arrows directed outwardly from the gate and N-channel transistors (NFETs) having the arrows directed inwardly.

The typical prior art multi-input NOR gate circuit 10 includes a plurality of (four) PFETs, 13, 14, 15 and 16, connected electrically in series between a power supply voltage $V_{DD}$ and an output node 20 and encompassed by broken block P. The output node is connected to a utilization circuit represented by block 23.

The output node 20 is connected to a reference voltage (shown as ground) through each of a plurality of mutually parallel connected NFETs 30, 31, 32, and 33 encompassed by broken block N. Logic inputs A, B, C and D are applied, during operation, to the respective PFETs and NFETs as shown. If, and only if, all of the inputs A, B, C and D are low, then output node 20 is "pulled-up" to $V_{DD}$. If any of the inputs to an NFET is high, node 20 is "pulled-down" (grounded) via one (or more) of the gates 30, 31, 32 or 33. For any given combination of input signals either the PFET or the NFET segments conducts. In no case do both segments conduct. This organization guarantees that the voltage level at output node 20 is very nearly ground or $V_{DD}$. Note that in the prior art circuit, there are n PFETs required between the source of voltage and the ouptut node for n inputs.

Figure 2:
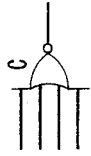
FIGS. 2, 3, 5 and 6A through 6F are symbolic representations of prior art circuits and corresponding circuit representations which will be useful in the exposition of this invention.
Figure 3:
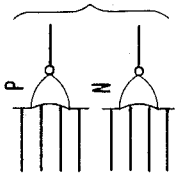

The conventional symbolic logic diagram for the circuit of FIG. 1 is shown in FIG. 2. This diagram includes but a single logic gate, a conventional NOR gate symbol, representing the four NFETs of the NFET segment, (broken) block N of FIG. 1, plus the four PFETs of the PFET segment, (broken) block P of FIG. 1. FIG. 3 shows a nonconventional symbol representation, in which P and N segments are separated, which also represents the CMOS logic function of the circuit of FIG. 1. Note that FIG. 3 shows a separate symbol for each of the PFET and NFET segments of the circuit of FIG. 1.

Figure 4:
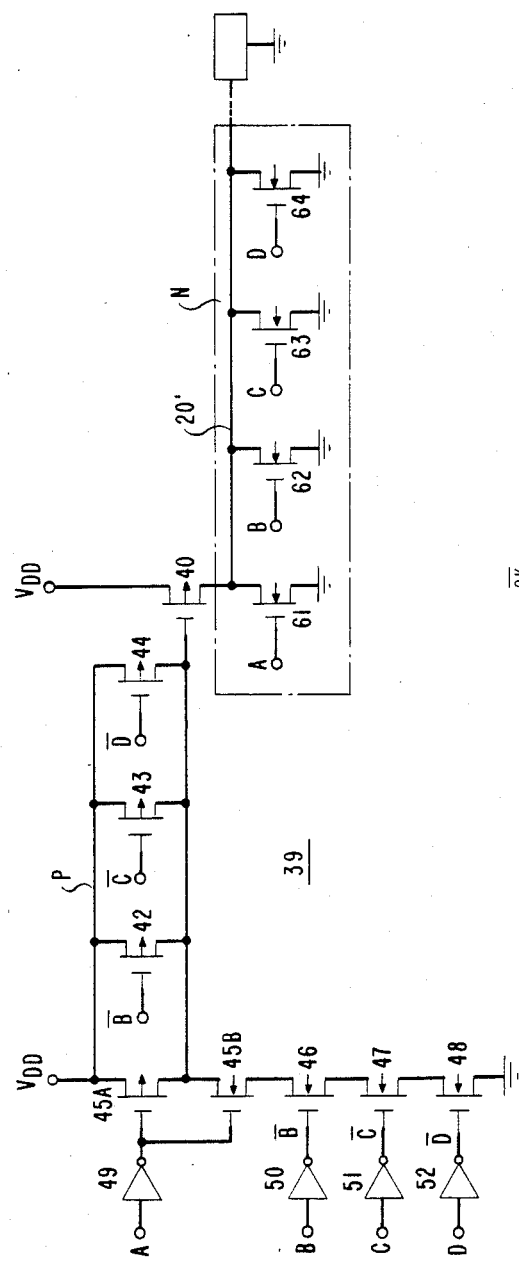
FIG. 4 is a circuit diagram of an alternative multi-input CMOS static logic gate for implementing the function of the circuit of FIG. 1 in accordance with the invention.

The novel circuit 39 of FIG. 4 performs the same logic operation as does the circuit of FIG. 1. The circuit comprises an N block that is identical with that of FIG. 1. The P block, on the other hand, is different as can be seen by comparative inspection of FIGS. 1 and 4. In the embodiment of FIG. 4, the P block includes only one PFET 40 connected between $V_{DD}$ and the output node. But an auxiliary logic network, comprising PFETs 42, 43, 44, and 45A, and NFETs 45B, 46, 47, and 48, is connected to the gate electrode terminal 41 of PFET 40 to provide a logic function which is equivalent to that of the P block of the circuit of FIG. 1.

The auxiliary logic network of the circuit of FIG. 4 comprises a first circuit arrangement of four PFETs 42, 43, 44 and 45A connected electrically mutually in parallel between power supply $V_{DD}$ and gate terminal 41. The network also comprises a second circuit arrangement of four NFETs 45B, 46, 47, and 48 serially connected between gate terminal 41 and a reference voltage shown as ground. Each of input signals A, B, C, and D is connected through inverters 49, 50, 51 and 52 to the gate terminals of NFETs 45B, 46, 47 and 48, respectively, thus applying complementary input signals $\overline{A}$, $\overline{B}$, $\overline{C}$, and $\overline{D}$ to the gate terminals of NFETs 45B, 46, 47 and 48. Complementary input $\overline{A}$ is also applied to the gate terminal of the PFET 45A. Inputs A, B, C, and D are applied directly to NFETs 61, 62, 63 and 64. It can be appreciated that the output node 20' of the circuit 39 is either at ground or at $V_{DD}$ during operation depending upon the input signals in the same way as is the case with the circuit 10 of FIG. 1.

As is clear from FIG. 4, only one PFET 40 is connected between $V_{DD}$ and node 20'. Consequently, it is relatively easy to adjust the time delay of the PFET 40 to be equal to the time delay of the N block because the PFET/NFET size ratio and the overall PFET parasitic capacitance can be very low. Moreover, the circuit of FIG. 4 can drive a greater number of receiver circuits, by at least a factor of four, because PFET 40 exhibits reduced back bias and reduced resistance when compared to the normal PFET pull-up arrangement which characterizes the prior art arrangement of FIG. 1.

Figure 5:
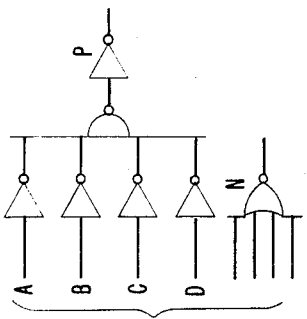

FIG. 5 shows the logic symbol equivalent diagram proposed for the circuit 39 of FIG. 4. The N and P portions of the circuit are represented separately as was the case in FIG. 3. As seen, the P block includes a parallel arrangement of four inverters whose outputs are the four inputs to a NAND circuit whose output supplies an inverter.

A variety of CMOS gate structures can be derived by representing logic functions of a gate with separate symbols for the pull-up and pull-down segments or blocks and then substituting logically equivalent circuits for the pull-up segments. In this connection, it will be helpful first to describe a variety of circuit equivalents, useful for the substitution. FIGS. 6A, 6B, 6C, 6D, 6E, and 6F show the relationships between simple logic circuits on the left hand side, together with the more complex equivalent circuit.

Figure 6:
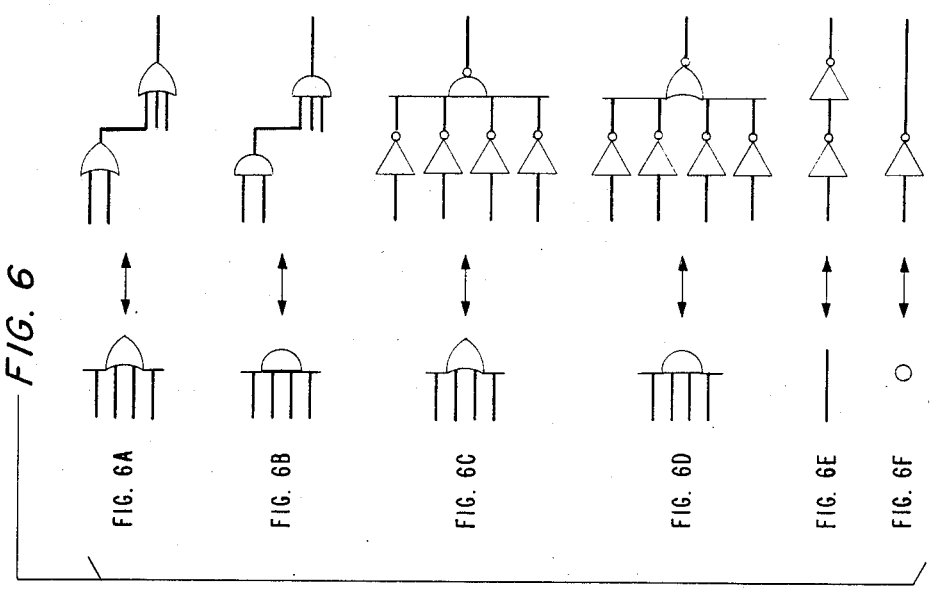

FIG. 6A shows that a four input OR can be simulated by a combination of a two input OR and a three input OR.

FIG. 6B shows that a four input AND is the equivalent of a two input AND and a three input AND.

FIG. 6C shows that a four input OR is the equivalent of four parallel inverters supplying a NAND.

FIG. 6D shows that a four input AND is the equivalent of four inverters supplying a NOR.

FIG. 6E shows that two inverters in series are the equivalent of an electrical connection if the delay is ignored.

By use of equivalents of the kind illustrated and the principles they illustrate, various complex circuits may be reconfigured to achieve particular desired modifications.

Figure 7:
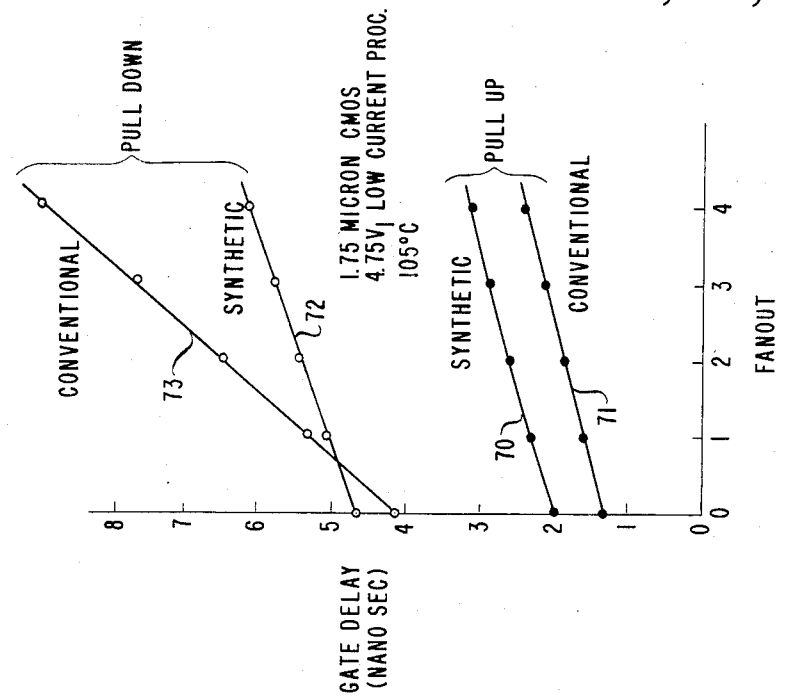
FIG. 7 is a plot of gate circuit delay versus fanout of the outputs of the prior art circuit of FIG. 1 and of a typical circuit of the type shown in FIG. 4.

FIG. 7 shows a plot of gate delay in nanoseconds against fanout (number of output destinations or receiver circuits) which may be driven by a conventional circuit of the type shown in FIG. 1 and by a like circuit in accordance with the principles of this invention. The latter circuits are identified as "synthetic" circuits. The pull-down delays are represented by curves 70 and 71. It is clear that the pull-down delay of the synthetic gate is greater than that of the conventional gate. But that is of little concern because the pull-down delay is very small in any case. It is also clear that the pull-up delay for the synthetic circuit is far superior as can be seen from curves 72 and 73—a 30 percent improvement at a fanout of 4.

Figure 8:
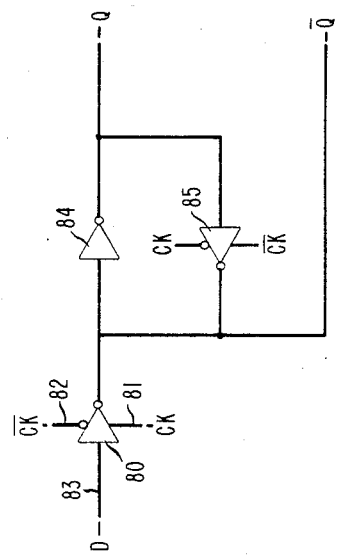
FIGS. 8 and 9 are alternative circuit diagrams of a prior art CMOS latch.

An analogous reconfiguration of circuits permits relatively fast CMOS latches to be achieved as well. FIG. 8 shows, symbolically, a prior art (delay) latch. The figure shows a tristate inverter 80 to which clock, clock bar and data pulses are applied via inputs 81, 82, and 83, respectively. The output of inverter 80 provides the $\overline{Q}$ output directly and the Q output via inverter 84. The output (Q) signal of inverter 84 also is adapted to provide the $\overline{Q}$ output signal via tristatable inverter 85.

Figure 9:
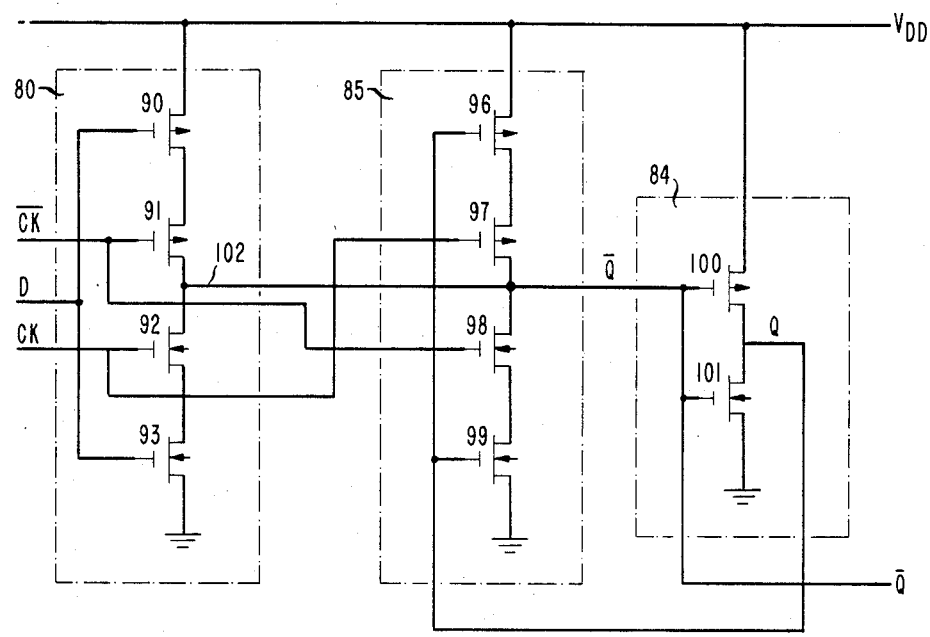

FIG. 9 shows the circuit of FIG. 8 in a P- and NFET implementation. PFETs 90 and 91 and NFETs 92 and 93 comprise inverter 80 of FIG. 8. PFETs 96 and 97 and NFETs 98 and 99 comprise inverter 85 of FIG. 8. PFET 100 and NFET 101 comprise inverter 84. Note that two PFETs, 90 and 91, are connected between $V_{DD}$ and output node 102.

Figure 10:
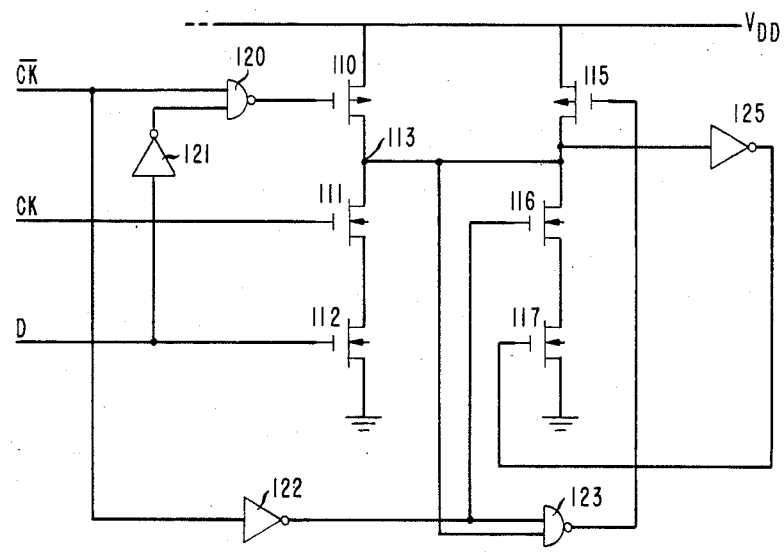
FIG. 10 is a circuit diagram of the equivalent CMOS latch of FIGS. 8 and 9 designed in accordance with the principles of the present invention.

FIG. 10 shows a synthetic circuit in accordance with this invention which is faster than that of FIG. 8 but performs the identical function. The circuit comprises an input stage including PFET 110 and NFETs 111 and 112 connected in the usual manner between $V_{DD}$ and ground with an output node at 113. A second stage comprises PFET 115 and NFETs 116 and 117 again connected in the usual manner between $V_{DD}$ and ground. The clock and clock bar inputs are applied to the gate of PFET 110 and NFET 111, respectively, the clock bar input being applied through NAND circuit 120. The data input is applied to the gate of NFET 112 and to the gate of PFET 110 through inverter 121 and NOR circuit 120 as shown. The clock bar input also is applied to the gate of PFET 115 via inverter 122 and NAND circuit 123 as shown and to the gate of NFET 116 via inverter 122 alone. Output node 113 also is connected to the gate of PFET 115 via NOR circuit 123 and to the gate of transistor 117 via inverter 125. Although the circuit of FIG. 10 includes additional components over the circuit of FIG. 9, only a single PFET (110) is connected between $V_{DD}$ and output node 113, whereas two PFETs, 90 and 91, are so connected in FIG. 9. Those (pull-up) PFETs are the pacing components in the circuit and the fewer pull-up PFETs in the circuit of FIG. 10 permit about a 30 per cent increase in the speed of operation over that achieved with the circuit of FIGS. 8 and 9.

The most obvious advantage of a synthetic gate is the capability of shortening the familiar chain of series-connected PFETs in a NOR-like gate. The shortened chain allows the synthetic gate to drive large capacitive loads as was mentioned hereinbefore. Further, it is now known that NFETs show improved delay characteristics when scaled down. PFETs do not. In the absence of synthetic gate circuits, logic functions would have to be implemented increasingly solely in NFETs--dynamic logic circuits will have to be used. For CMOS circuits with submicron feature size, desirable short delay times can be realized presently only by synthetic circuits of the type described herein.

The circuit is rendered relatively insensitive to process-induced variations by equating the pull-up delays of the N block to the pull-up delays of the P block and by equating the pull-down delays of the N block to the pull-down delays of the P block, as disclosed in my copending application Ser. No. 580,232 filed Feb. 15, 1984.

What is claimed is:

1. A CMOS logic gate arrangement having n separate inputs, said arrangement comprising an NFET pull-down segment and a PFET pull-up segment, said NFET pull-down segment comprising n NFETs whose source-drain paths are connected in parallel between an output node and a reference potential, each of said NFETs having its gate coupled to a separate one of the n inputs, said PFET pull-up segment comprising at least a first PFET element connected drainto-source between a source of supply voltage and said output node, said arrangement also comprising an auxiliary FET circuit arrangement for generating a control signal depending upon the inputs and for applying the control signal at least to the gate electrode of said first PFET element for pulling up said output node, the auxiliary FET circuit including an NFET portion comprising n NFETs and a PFET portion comprising n PFETs, at least one NFET of the auxiliary circuit having its gate electrode coupled through a separate inverter to a separate one of said n inputs, each PFET of the auxiliary circuit having its gate electrode coupled through a separate inverter to a separate one of said n inputs, and the control signal being generated at a node between the PFET portion and NFET portion of the auxiliary FET circuit.

2. A logic gate arrangement in accordance with claim 1 wherein the NFETs of said auxiliary FET circuit arrangement are connected in series drainto-source between a gate electrode of the first PFET element and the reference potential, and wherein the PFETs of the auxiliary FET circuit arrangement are connected mutually in parallel between said gate electrode of the first PFET and a source of supply voltage.

3. A gate arrangement in accordance with claim 1 wherein the pull-up delays of the NFETs in said pull-down segment and the pull-up delays of the PFETs in said pullup segment are equal, and wherein the pull-down delays of the NFETs in said pull-down segment and the pull-down delays of the PFETs in said pull-up segment are equal.

4. A CMOS logic gate for performing the NAND function of $n>2$ logic signal inputs, said logic gate including an output node and first and second means responsive to said n logic signal inputs for controllably switching the voltage at said output node between a source voltage and a reference voltage, said first means comprising $m<n$ PFETs connected in series between said source voltage and said output node, and said first means further comprising input means comprising a first PFET circuit arrangement having n PFET elements each of whose gate electrodes is coupled to a separate one of the logic signal inputs, and said first PFET circuit arrangement having a node connected to the gate electrode of one of said m PFETs for controllably pulling said output node up to said source voltage, said second means comprising n NFETs having their source-drain paths mutually connected in parallel between said output node and said reference voltage, each of said NFETs having a gate electrode connected to a separate one of said logic signal inputs for controllably pulling said output node down to said reference voltage.

5. A CMOS logic circuit in accordance with claim 4 wherein said first means further includes a second NFET circuit arrangement including a network of NFETs connected between the gates of said m PFETs and said reference voltage, each of the NFETs of the second NFET circuit having a gate electrode coupled to a separate one of the inputs.

* * * * *